(12) United States Patent
Bai

(10) Patent No.: US 10,833,636 B2
(45) Date of Patent: Nov. 10, 2020

(54) METHOD FOR IMPROVING LINEARITY OF RADIO FREQUENCY POWER AMPLIFIER, COMPENSATION CIRCUIT AND COMMUNICATIONS TERMINAL

(71) Applicant: SHANGHAI VANCHIP TECHNOLOGIES CO., LTD., Shanghai (CN)

(72) Inventor: Yunfang Bai, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 14 days.

(21) Appl. No.: 16/064,470

(22) PCT Filed: Dec. 22, 2016

(86) PCT No.: PCT/CN2016/111483
§ 371 (c)(1),
(2) Date: Jun. 21, 2018

(87) PCT Pub. No.: WO2017/107949
PCT Pub. Date: Jun. 29, 2017

(65) Prior Publication Data
US 2019/0007001 A1 Jan. 3, 2019

(30) Foreign Application Priority Data

Dec. 22, 2015 (CN) .......................... 2015 1 0975245

(51) Int. Cl.
*H03F 1/30* (2006.01)
*H03F 1/32* (2006.01)
(Continued)

(52) U.S. Cl.
CPC ........... *H03F 1/3276* (2013.01); *H03F 1/083* (2013.01); *H03F 1/301* (2013.01); *H03F 1/302* (2013.01);
(Continued)

(58) Field of Classification Search
CPC .......... H03F 1/3276; H03F 3/245; H03F 1/56; H03F 1/34; H03F 3/213
(Continued)

(56) References Cited

U.S. PATENT DOCUMENTS 4,864,251 A * 9/1989 Baur ........................ H03G 3/30
330/285
5,117,203 A * 5/1992 Tennyson ................ H03F 1/565
330/294
(Continued)

FOREIGN PATENT DOCUMENTS

CN 1437792 A 8/2003
CN 1627638 A 6/2005
(Continued)

*Primary Examiner* — Khanh V Nguyen
*Assistant Examiner* — Khiem D Nguyen
(74) *Attorney, Agent, or Firm* — Soroker Agmon Nordman

(57) ABSTRACT

A method for improving the linearity of a radio frequency power amplifier, a compensation circuit (307) for implementing the method, and a communications terminal with the compensation circuit (307). In the method, a compensation circuit (307) is connected between a base (a3) and a collector (b3) of a transistor of a common emitter amplifier (306), in order to neutralize the impact of a variation in capacitance between the base (a3) and the collector (b3) of the transistor (306) according to a radio frequency signal. No additional direct-current power consumption is needed, and degradation in performance of other radio frequency power amplifiers can be avoided. The corresponding compensation circuit (307) can be easily integrated with a main amplifi-
(Continued)

cation circuit, without affecting other performance of the main amplification circuit, and provides high adjustability.

12 Claims, 3 Drawing Sheets

(51) Int. Cl.
- *H03F 3/24* (2006.01)
- *H03F 1/34* (2006.01)
- *H03F 1/56* (2006.01)
- *H03F 1/08* (2006.01)
- *H03F 3/19* (2006.01)
- *H03F 3/195* (2006.01)
- *H03F 3/213* (2006.01)

(52) U.S. Cl.
CPC ............... *H03F 1/34* (2013.01); *H03F 1/56* (2013.01); *H03F 3/19* (2013.01); *H03F 3/195* (2013.01); *H03F 3/213* (2013.01); *H03F 3/245* (2013.01); *H03F 2200/126* (2013.01); *H03F 2200/216* (2013.01); *H03F 2200/267* (2013.01); *H03F 2200/297* (2013.01); *H03F 2200/301* (2013.01); *H03F 2200/303* (2013.01); *H03F 2200/451* (2013.01); *H03F 2201/3215* (2013.01)

(58) Field of Classification Search
USPC ........................................ 330/307, 290, 259
See application file for complete search history.

(56) References Cited

U.S. PATENT DOCUMENTS

| 5,392,463 | A | * | 2/1995 | Yamada | ................ | H03F 1/0261 |
| | | | | | | 330/284 |
| 6,452,452 | B1 | * | 9/2002 | Furino, Jr. | ................ | H03F 1/34 |
| | | | | | | 330/278 |

FOREIGN PATENT DOCUMENTS

| CN | 201298824 Y | 8/2009 |
| CN | 102324898 A | 1/2012 |
| CN | 103326675 A | 9/2013 |
| CN | 103715997 A | 4/2014 |
| CN | 203800891 U | 8/2014 |
| CN | 105515539 A | 4/2016 |

* cited by examiner

METHOD FOR IMPROVING LINEARITY OF RADIO FREQUENCY POWER AMPLIFIER, COMPENSATION CIRCUIT AND COMMUNICATIONS TERMINAL

BACKGROUND

Technical Field

The present invention belongs to the field of wireless communications technologies, relates to a method for improving linearity of a radio frequency power amplifier, and meanwhile, also relates to a compensation circuit for implementing the method and a communications terminal including the compensation circuit.

Related Art

Currently, various portable wireless communications devices are widely applied. The wireless communications devices increase an amplitude of a signal by using a radio frequency power amplifier, so as to emit and transmit out the signal through an antenna. As 4G LTE systems are widely applied, requirements of wireless communications systems on efficiency and a linearity indicator of the radio frequency power amplifier are higher. On the other hand, the portable wireless communications devices have smaller sizes, higher integration levels, and lower costs. This requires that the linearization technology needs to be achieved with smaller sizes and lower costs.

For a radio frequency power amplifier, its linearity and power efficiency are in a negative correlation relationship. Consequently, a non-linear amplification phenomenon is likely to occur in the radio frequency power amplifier. Non-linear amplification would cause signal distortion inside a channel and a spectral leakage outside a channel. The former leads to degradation of an error vector magnitude (EVM), and the latter would cause adjacent channel interference.

In the prior art, there are a lot of methods for improving linearity and power efficiency of a radio frequency power amplifier, where the most direct method is improving circuit design, and includes, for example, the Doherty radio frequency power amplifier design scheme, the dynamic bias technology, and the radio frequency envelope elimination and restoration technology. However, during implementation processes, the methods all have its restrictions and difficulty, and most of them are currently in a theoretical research phase.

Another effective approach for improving linearity of a radio frequency power amplifier is using the linearization technology. The linearization technology can improve the linearity of the radio frequency power amplifier without sacrificing power efficiency greatly. In an ideal situation, after the linearization technology is performed, a linearization region that can be used by the radio frequency power amplifier can be expanded to a saturation region of the radio frequency power amplifier, so as to improve linearity of the radio frequency power amplifier while ensuring its efficiency, thereby reducing signal distortion into an acceptable range.

SUMMARY

With regard to disadvantages of the prior art, the first technical problem to be resolved by the present invention is to provide a method for improving linearity of a radio frequency power amplifier. The method is implemented by neutralizing an impact of a variation in base-collector capacitance of a bipolar junction transistor (BJT).

Another technical problem to be resolved by the present invention is to provide a compensation circuit, configured to implement the foregoing method.

Still another technical problem to be resolved by the present invention is to provide a communications terminal including the foregoing compensation circuit.

To achieve the foregoing invention objectives, the following technical solutions are used by the present invention:

A method for improving linearity of a radio frequency power amplifier is provided, where a compensation circuit is connected between a base and a collector of a transistor of a common emitter amplifier, and the compensation circuit is configured to neutralize an impact of a variation in capacitance between the base and the collector of the transistor according to a radio frequency signal.

Preferably, the compensation circuit is implemented by using a non-linear capacitance variation of a diode under different bias conditions.

A compensation circuit includes an inductor, a capacitor, and a diode that have a common node, where the other end of the inductor is connected to a bias voltage, and the other end of the capacitor is connected to a base of the transistor, and an anode of the diode is connected to a collector of the transistor, and a cathode thereof is connected to the common node.

Alternatively, a compensation circuit includes an inductor, a capacitor, and a diode that have a common node, where the other end of the inductor is connected to a bias voltage, and the other end of the capacitor is connected to a collector of the transistor; and an anode of the diode is connected to the common node, and a cathode thereof is connected to a base of the transistor.

Alternatively, a compensation circuit is divided into two parts, a first compensation circuit and a second compensation circuit, where one end of the first compensation circuit is connected to a base of the transistor, and the other end is grounded; and one end of the second compensation circuit is connected to a collector of the transistor, and the other end is grounded.

Preferably, the first compensation circuit includes a first inductor, a first capacitor, and a first diode that have a common node, where the other end of the first inductor is connected to a first bias voltage, and the other end of the first capacitor is grounded; and an anode of the first diode is connected to the common node, and a cathode thereof is connected to the base of the transistor.

Preferably, the second compensation circuit includes a second inductor, a second capacitor, and a second diode that have a common node, where the other end of the second inductor is connected to a second bias voltage, and the other end of the second capacitor is grounded; and an anode of the second diode is connected to the collector of the transistor, and a cathode thereof is connected to the common node.

Preferably, by setting a bias voltage, a voltage drop of the diode is less than an on-stage voltage.

Preferably, the capacitor, on the one hand, blocks a direct current, and on the other hand, together with a parasitic capacitance of the diode, neutralizes an impact of a variation in capacitance between the base and the collector of the transistor according to a radio frequency signal.

Preferably, the inductor is a high-frequency choke inductor.

Preferably, the transistor is an NPN-type BJT.

Preferably, the transistor is a heterojunction bipolar transistor (HBT) transistor.

A chip includes the foregoing compensation circuit.

A communications terminal includes the foregoing compensation circuit or chip.

Compared with the prior art, the present invention mainly uses non-linear capacitance of a diode under different bias conditions to neutralize a variation in capacitance Cbc of a BJT caused by an amplitude of a radio frequency signal, thereby improving linearity of the whole radio frequency power amplifier. The present invention does not need additional direct-current power consumption, and would avoid degradation in performance of other radio frequency power amplifiers. The corresponding compensation circuit can be easily integrated with a main amplification circuit, without affecting other performance of the main amplification circuit, and provides high adjustability.

DETAILED DESCRIPTION

The following further describes the technical content of the present invention in detail with reference to the accompanying drawings and specific embodiments.

Figure 1:
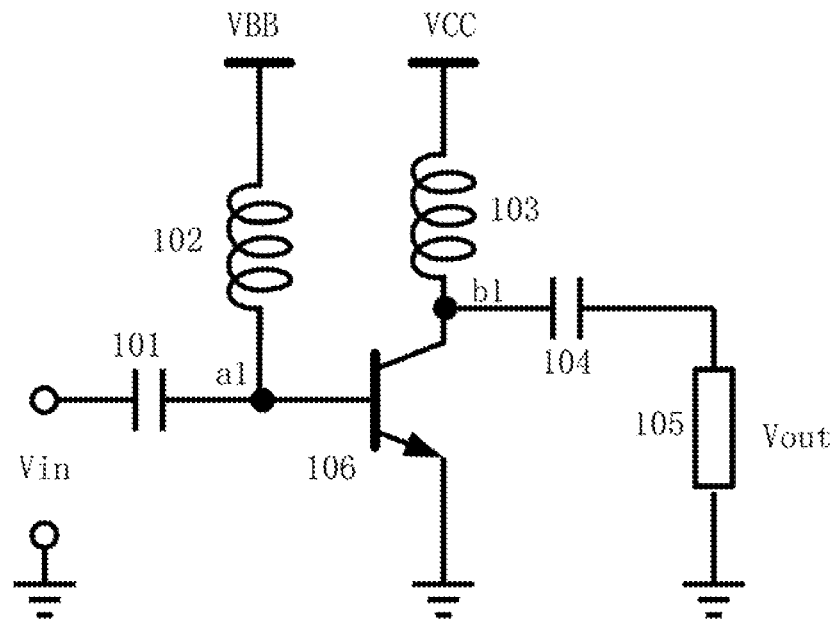
FIG. 1 is a circuit principle diagram of a typical common emitter amplifier.

FIG. 1 shows a typical common emitter amplifier. Such a structure is widely applied to radio frequency power amplifiers, where 101 is an input direct-current blocking capacitor, 104 is output direct-current blocking capacitor, 106 is an NPN-type BJT, 105 is load impedance ZL, a bias voltage VBB is applied to a base a1 of the transistor 106 by using an inductor 102, and a bias voltage VCC is applied to a collector b1 of the transistor 106 by using an inductor 103.

Figure 2:
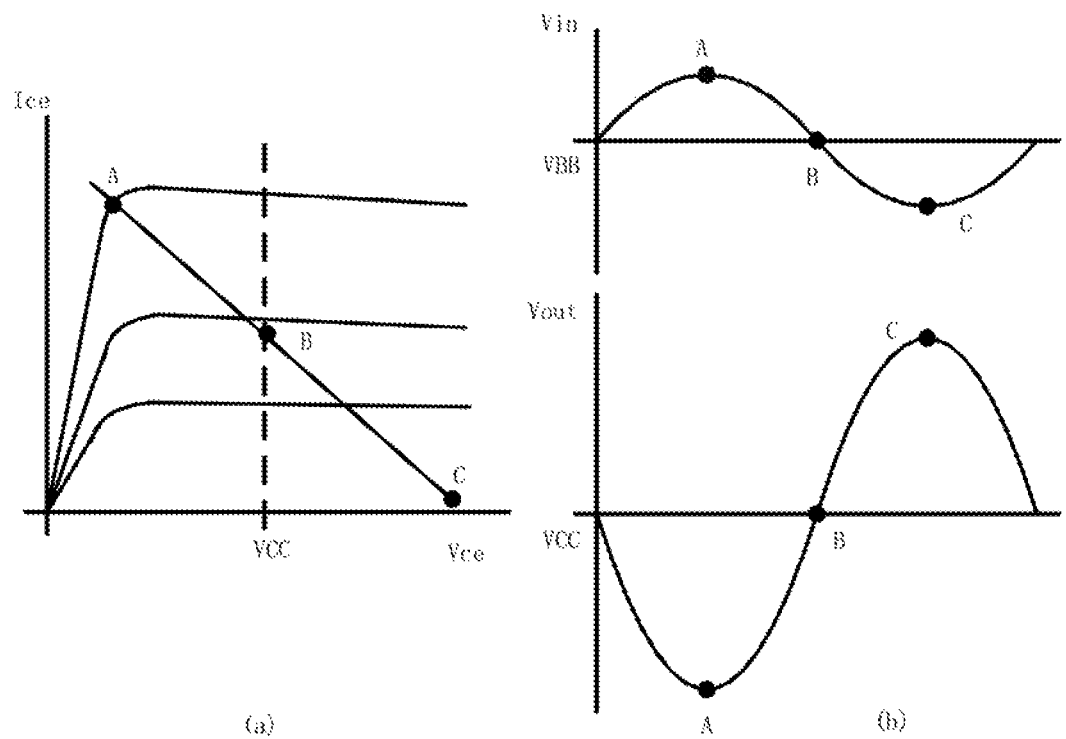
FIG. 2(a) is a diagram of an output load curve of the common emitter amplifier shown in FIG. 1 when the common emitter amplifier works in a class A.
FIG. 2(b) is a voltage waveform diagram of a base a1 and a collector b1 of a transistor 106 when the common emitter amplifier shown in FIG. 1 works in a class A.

FIG. 2(a) shows an output load curve of the foregoing common emitter amplifier when the foregoing common emitter amplifier works in a class A (that is, a completely linear range), where A, B, and C are three bias points on the load curve. Without taking a high-order effect into consideration, a phase of an input voltage of a base of a common emitter amplifier is different from a phase of an output voltage of a collector of the common emitter amplifier by 180 degrees. The corresponding gain may be expressed as follows:

$$A_v = \frac{V_{out}}{V_{in}} = -g_m R_L \quad (1)$$

where gm is transconductance of a BJT, and RL is a real part of the load impedance ZL.

FIG. 2(b) shows voltage waveforms of the base a1 and the collector b1 of the transistor 106 when the foregoing common emitter amplifier works in the class A (that is, a completely linear range). It could be learned from the figure that in proximity to the point A, a voltage difference Vbc between the base and the collector reaches a maximum value, and in this case, parasitic capacitance between the base and the collector of the transistor reaches a maximum value. In a process in which a working point starts from the point A, passes the point B, and reaches the point C, the voltage difference Vbc between the base and the collector gradually decreases and starts reversal of biasing, in this case, the corresponding parasitic capacitance between the base and the collector also gradually decreases, and when the working point reaches the point C, the Cbc reaches a minimum value.

The phenomena shown in FIG. 2(a) and FIG. 2(b) indicate that when the radio frequency power amplifier works at a relatively large amplitude of the radio frequency signal, a relatively large variation occurs in capacitance Cbc between the base and the collector. Consequently, the radio frequency power amplifier works in a non-linear state. Therefore, a basic thought of the method for improving linearity of a radio frequency power amplifier provided by the present invention is improving the linearity of the radio frequency power amplifier by neutralizing a variation in the Cbc. Specifically, a non-linear circuit is added to completely or partially neutralize a non-linear variation tendency caused by a variation in base-collector capacitance Cbc of the BJT, and a non-linear variation tendency of the compensation circuit is exactly opposite to the tendency of the variation in the capacitance Cbc between the base and the collector of the transistor according to the radio frequency signal.

Specific descriptions are provided below in detail with reference to different embodiments.

It should be first noted that an HBT is a BJT. Its emitter region and base region are made of different semiconductor materials. In this way, an emitter junction (that is, a PN junction between the emitter region and the base region) forms a heterojunction. A notable feature of the HBT is having an emitter region with a wide band gap, so that carrier injection efficiency of an emitter junction is greatly improved, and series resistance of a base region is reduced. Excellent performance of the HBT includes a high speed, a high power, low noise, good linearity, single-power-supply working, and the like. The HBT is widely applied to the fields such as the field of radio frequency power amplifiers, the field of high-speed digital circuits, the field of analog/digital converters, and the field of optical communications and mobile communications. Therefore, in the following embodiments, the HBT is used as an example of all the used BJTs for description. However, the present invention is not limited to being used in an HBT. In fact, for an NPN-type BJT, either made of GaAs or GaN, commonly used in common emitter amplifiers, the technical solution provided by the present invention can be used.

Figure 3:
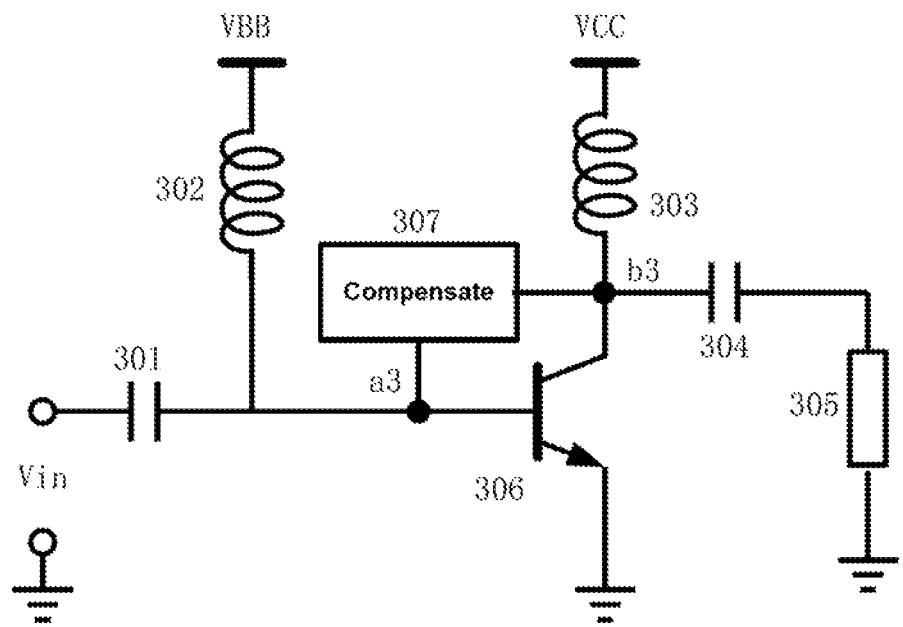
FIG. 3 is a circuit principle diagram of a first embodiment of the present invention.
Figure 4:
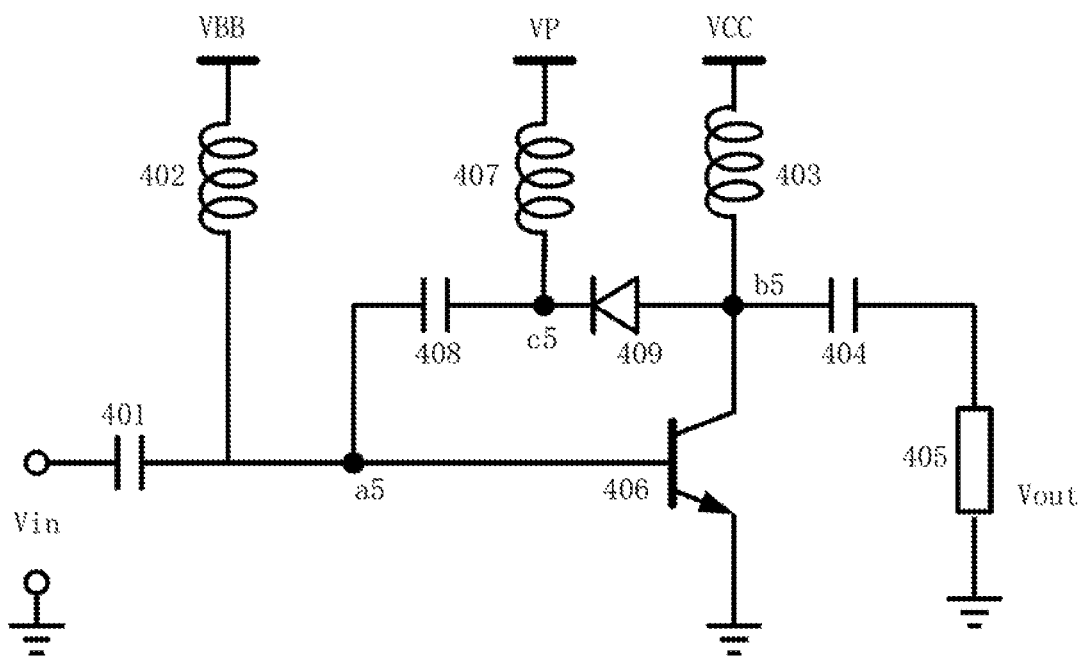
FIG. 4 is a circuit principle diagram of a common emitter amplifier including a compensation circuit shown in FIG. 3.

A first embodiment of the present invention is shown in FIG. 3, where 301 is an input direct-current blocking capacitor, 304 is output direct-current blocking capacitor, 306 is an HBT, 305 is load impedance ZL, a bias voltage VBB is applied to a base a3 of the transistor 306 by using an inductor 302, and a bias voltage VCC is applied to a collector b3 of the transistor 306 by using an inductor 303. The compensation circuit 307 is a non-linear compensation circuit connected between the base and the collector of the transistor and its main feature is being opposite to the tendency of the variation in capacitance Cbc between the base and the collector of the transistor according to the radio frequency signal, so as to neutralize a disadvantageous impact caused by the capacitance Cbc. The compensation circuit 307 is mainly implemented by a diode in cooperation with a corresponding passive element. FIG. 4 provides an implementation circuit example of the compensation circuit.

FIG. 4 is an exemplary circuit principle diagram of a single-stage common emitter amplifier including the compensation circuit, where 401 is an input direct-current blocking capacitor, one end thereof is connected to an input signal, and the other end there of is connected to a base node a5 of a transistor 406; and 404 is an output direct-current blocking capacitor, one end thereof is connected to an output load 405, the other end there of is connected to a collector node b5 of the transistor 406. Inductors 402, 403, and 407 are all high-frequency choke inductors. A bias voltage VBB is connected to the base node a5 of the transistor 406 by using the inductor 402, a power supply voltage VCC is connected to the collector node b5 of the transistor 406 by using the inductor 403, and a bias voltage VP is connected to a node c5 by using the inductor 407. One end of a capacitor 408 is connected to the node a5, and the other end thereof is connected to the node c5. An anode of a diode 409 is connected to the node b5, and a cathode thereof is connected to the node c5.

In the circuit shown in FIG. 4, the inductor 407, the capacitor 408, and the diode 409 have a common node c5, and they form the foregoing compensation circuit together. The capacitor 408 and the diode 409 are configured to compensate for a Cbc non-linear variation caused when the transistor 406 works at the radio frequency signal, and specific descriptions are provided as follows.

A direct-current voltage drop between two ends of the diode 409 may be expressed as follows:

$$V_{PN}=VCC-VP \qquad (2)$$

A value of a bias voltage VP is properly set to make a voltage drop VPN of the diode less than an on-stage voltage Vth. In this case, the diode is off, thereby avoiding additional direct-current power consumption. When a radio frequency signal is input, in a half period in which a transient voltage of the node a5 increases, a transient voltage of the node b5 decreases. In this case, parasitic capacitance Cbc of the transistor 406 is larger, but the diode 409 more tends to be off, and parasitic capacitance thereof is smaller. Therefore, a variation in equivalent total capacitance between the nodes a5 and b5 tends to be smaller. Similarly, in a half period in which the transient voltage of the node a5 decreases, the transient voltage of the node b5 increases. In this case, the parasitic capacitance Cbc of the transistor 406 is smaller, but the diode 409 more tends to be on, and the parasitic capacitance thereof is larger. Therefore, a variation in the equivalent total capacitance between the nodes a5 and b5 also tends to be smaller. Therefore, the value of the bias voltage VP may be adjusted to further adjust a variation amplitude of the capacitance of the diode 409. Such adjustment can be carried out by a person of ordinary skill in the art according to experience and details are not described herein.

The foregoing circuit, the capacitor 408 produces a direct-current blocking effect, and meanwhile, can be configured to adjust a capacitance value of the compensation circuit.

On the other hand, based on the Miller rule, an impact of the capacitance Cbc between the base and the collector of the transistor can be equivalently divided into two parts. One part is base-to-ground capacitance, and the other part is collector-to-ground capacitance. Therefore, the compensation can alternatively be correspondingly divided into two parts and implemented.

It should be noted that the compensation circuit shown in FIG. 4 is merely a basic example. For the compensation circuit, there are also many other derivative embodiments. For example, locations of the capacitor 408 and the diode 409 may be exchanged, and in this case, a compensation effect depends on a difference between the VBB and the bias voltage VP. For another example, in the compensation circuit shown in FIG. 4, a capacitor is disposed between the nodes b5 and c5. That is, a capacitor is further connected in parallel to the two ends of the diode 409. The compensation effect can be further improved.

Figure 5:
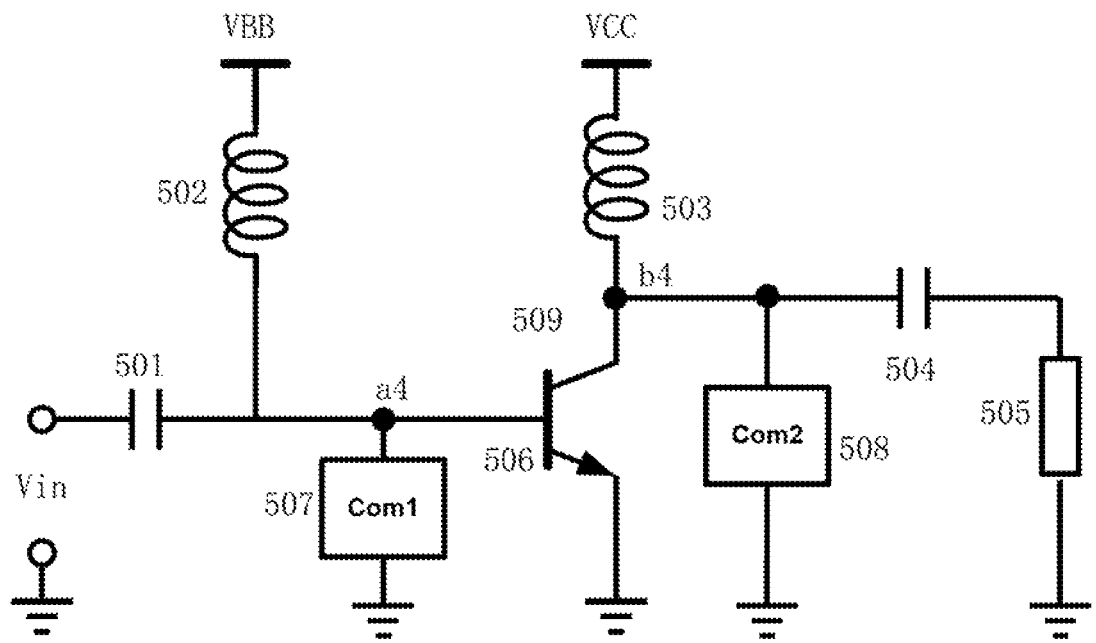
FIG. 5 is a circuit principle diagram of a second embodiment of the present invention.

A second embodiment of the present invention is shown in FIG. 5, where 501 is an input direct-current blocking capacitor, 504 is output direct-current blocking capacitor, 506 is an HBT, 505 is load impedance ZL, a bias voltage VBB is applied to a base a4 of the transistor 506 by using an inductor 502, and a bias voltage VCC is applied to a collector b4 of the transistor 503 by using an inductor 506. A first compensation circuit 507 is a non-linear compensation circuit connected between the base of the transistor and the ground, and the second compensation circuit 508 is a non-linear compensation circuit connected between the collector of the transistor and the ground. The two compensation circuits 507 and 508 are mainly implemented by a diode in cooperation with a corresponding passive element. Specific descriptions are provided below in detail with reference to FIG. 6.

Figure 6:
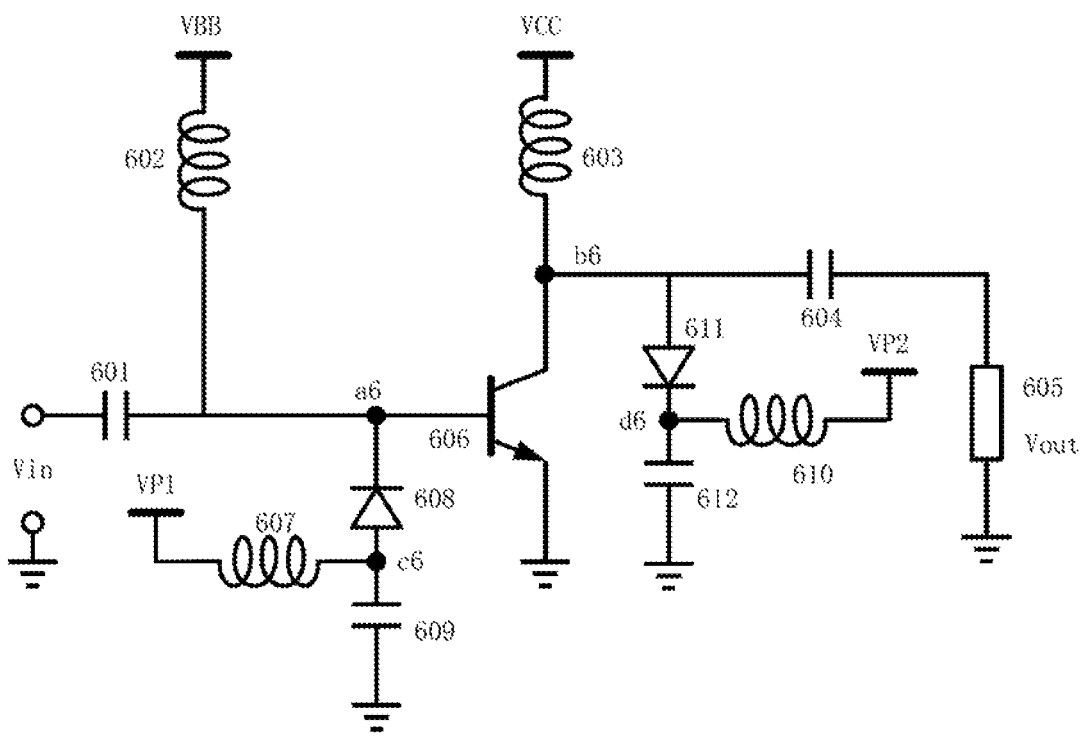
FIG. 6 is a circuit principle diagram of a common emitter amplifier including a compensation circuit shown in FIG. 5.

As shown in FIG. 6, an inductor 607, a diode 608, and a capacitor together form a first compensation circuit, configured to compensate for a base-to-ground impact of an equivalent of parasitic capacitance Cbc of a transistor; and an inductor 610, a diode 611, and a capacitor 612 together form a second compensation circuit, configured to compensate for a collector-to-ground impact of an equivalent of the parasitic capacitance Cbc of the transistor. It should be noted that based on a compensation effect, the two compensation circuits may coexist, or only one of them is used.

In FIG. 6, 601 is an input direct-current blocking capacitor, one end thereof is connected to an input signal, and the other end there of is connected to a base node a6 of a transistor 606; and 604 is an output direct-current blocking capacitor, one end thereof is connected to an output load 605, the other end there of is connected to a collector node b6 of the transistor 606. Inductors 602, 603, 607, and 610 are all high-frequency choke inductors. A bias voltage VBB is connected to the base node a6 of the transistor 606 by using the inductor 602, and a power supply voltage VCC is connected to the collector node b6 of the transistor 606 by using the inductor 603. A bias voltage VP1 is connected to a node c6 by using the inductor 607. One end of a capacitor 609 is connected to the node c6, and the other end thereof is grounded. An anode of the diode 608 is connected to the node c6, and a cathode thereof is connected to the node a6. A bias voltage VP2 is connected to a node d6 by using the inductor 610. One end of the capacitor 612 is connected to the node d6, and the other end thereof is grounded. An anode of the diode 611 is connected to the node d6, and a cathode thereof is connected to the node b5.

A direct-current voltage drop between two ends of the diode 608 may be expressed as follows:

$$V_{PN1}=VP1-VBB \qquad (3)$$

A direct-current voltage drop between two ends of the diode 611 may be expressed as follows:

$$V_{PN2} = VCC - VP2 \quad (4)$$

Values of bias voltages VP1 and VP2 are properly set to make voltage drops VPN1 and VPN2 of the diode less than an on-stage voltage Vth. In this case, both of the diodes are off, thereby avoiding additional direct-current power consumption. When a radio frequency signal is input, in a half period in which a transient voltage of the node a6 increases, a transient voltage of the node b6 decreases. In this case, the diode 608 more tends to be off, and compensation capacitance introduced by branches 608 and 609 gradually decreases; and similarly, the diode 611 more tends to be off, and compensation capacitance introduced by branches 611 and 612 also gradually decreases. In this case, parasitic capacitance Cbc of the transistor 606 is larger. Therefore, the two additional compensation branches can weaken a variation tendency in Cbc respectively on a base end and a collector end.

In a half period in which a transient voltage of the node a6 decreases, a transient voltage of the node b6 increases. In this case, the diode 608 more tends to be on, and compensation capacitance introduced by the branches 608 and 609 gradually increases; and similarly, the diode 611 more tends to be on, and compensation capacitance introduced by the branches 611 and 612 also gradually increases. In this case, parasitic capacitance Cbc of the transistor 606 is smaller. Therefore, the two additional compensation branches can also weaken a variation tendency in Cbc respectively on a base end and a collector end.

In view of the description above, amplitudes of the diodes 608 and 611, the inductors 607 and 610, and the capacitors 609 and 612 can be properly selected by properly adjusting the bias voltages VP1 and VP2, so as to produce a better compensation effect.

It should be noted that the compensation circuit described in the foregoing embodiments may be used in a chip. For the compensation circuit in the chip, details are not described herein again.

The foregoing compensation circuit may alternatively be used in a communications terminal as an important component of a radio frequency circuit. The communications terminal described herein means a computer device that can be used in a mobile environment, that supports various communications standards such as the GSM, EDGE, TD_SCDMA, TDD_LTE, and FDD_LTE, and that includes, but is not limited to, a mobile phone, a notebook computer, a tablet computer, and an on-vehicle computer. In addition, the compensation circuit is also applicable to other scenarios where linearity of a radio frequency power amplifier needs to be improved, for example, a communications base station compatible with various communications standards, and details are not described herein.

Compared with the prior art, the method provided by the present invention mainly uses non-linear capacitance of a diode under different bias conditions to neutralize a variation in capacitance Cbc of a BIT caused by an amplitude of a radio frequency signal, thereby improving linearity of the whole radio frequency power amplifier. The technical solutions of the present invention do not need additional direct-current power consumption, and would avoid degradation in performance of other radio frequency power amplifiers. The corresponding compensation circuit can be easily integrated with a main amplification circuit, without affecting other performance of the main amplification circuit, and provides high adjustability.

The compensation circuit provided by the present invention not only can be applied to a single-stage common emitter amplifier structure, but also can be applied to a two-stage or even multi-stage common emitter amplifier structure. The corresponding circuit structure adjustment is a common technical means that can be mastered by a person of ordinary skill in the art, and is not specifically described herein.

The method for improving linearity of a radio frequency power amplifier, the compensation circuit, and the communications terminal provided by the present invention are described in detail above. To a person of ordinary skill in the art, making any obvious modifications without departing from the essential spirit of the present invention constitute infringement on the present invention patent and corresponding legal responsibility will be undertaken.

What is claimed is:

1. A compensation circuit, connected between a base and a collector of a transistor of a common emitter amplifier and configured to neutralize an impact of a variation in capacitance between the base and the collector of the transistor according to a radio frequency signal, wherein
the compensation circuit comprises an inductor, a capacitor, and a diode that have a common node, another end of the inductor is connected to a bias voltage, and another end of the capacitor is connected to a base of the transistor; and an anode of the diode is connected to a collector of the transistor, and a cathode thereof is connected to the common node.

2. A compensation circuit, connected between a base and a collector of a transistor of a common emitter amplifier and configured to neutralize an impact of a variation in capacitance between the base and the collector of the transistor according to a radio frequency signal, wherein
the compensation circuit comprises an inductor, a capacitor, and a diode that have a common node, another end of the inductor is connected to a bias voltage, and another end of the capacitor is connected to a collector of the transistor; and an anode of the diode is connected to the common node, and a cathode thereof is connected to a base of the transistor.

3. A compensation circuit, configured to neutralize an impact of a variation in capacitance between a base and a collector of a transistor according to a radio frequency signal, wherein
the compensation circuit is divided into two parts, a first compensation circuit and a second compensation circuit, wherein one end of the first compensation circuit is connected to the base of the transistor, and another end is grounded; and one end of the second compensation circuit is connected to the collector of the transistor, and another end is grounded;
the first compensation circuit comprises a first inductor, a first capacitor, and a first diode that have a common node, wherein another end of the first inductor is connected to a first bias voltage, and another end of the first capacitor is grounded; and an anode of the first diode is connected to the common node, and a cathode thereof is connected to the base of the transistor.

4. The compensation circuit according to claim 3, wherein the second compensation circuit comprises a second inductor, a second capacitor, and a second diode that have a common node, wherein another end of the second inductor is connected to a second bias voltage, and another end of the second capacitor is grounded; and an anode of the second diode is connected to the collector of the transistor, and a cathode thereof is connected to the common node.

5. The compensation circuit according to claim 1, wherein by setting a bias voltage, a voltage drop of the diode is less than an on-stage voltage.

6. The compensation circuit according to claim 1, wherein the capacitor, on the one hand, blocks a direct current, and on the other hand, together with parasitic capacitance of the diode, neutralizes the impact of the variation in capacitance between the base and the collector of the transistor according to a radio frequency signal.

7. The compensation circuit according to claim 1, wherein the inductor is a high-frequency choke inductor.

8. The compensation circuit according to claim 1, wherein the transistor is an NPN-type bipolar junction transistor (BJT).

9. The compensation circuit according to claim 8, wherein the transistor is a heterojunction bipolar transistor (HBT) transistor.

10. The compensation circuit according to claim 2, wherein by setting a bias voltage, a voltage drop of the diode is less than an on-stage voltage.

11. The compensation circuit according to claim 3, wherein by setting a bias voltage, a voltage drop of the diode is less than an on-stage voltage.

12. The compensation circuit according to claim 2, wherein the capacitor, on the one hand, blocks a direct current, and on the other hand, together with parasitic capacitance of the diode, neutralizes the impact of the variation in capacitance between the base and the collector of the transistor according to a radio frequency signal.

* * * * *